(12) United States Patent
Ono (10) Patent No.: US 7,257,003 B2
(45) Date of Patent: Aug. 14, 2007

(54) ELECTRONIC UNIT CASING

(75) Inventor: Kimihiro Ono, Zama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 350 days.

(21) Appl. No.: 11/059,338

(22) Filed: Feb. 17, 2005

(65) Prior Publication Data

US 2005/0185381 A1   Aug. 25, 2005

(30) Foreign Application Priority Data

Feb. 23, 2004   (JP)   ............................. 2004-045746

(51) Int. Cl.
*H05K 7/20*   (2006.01)

(52) U.S. Cl. ............... 361/704; 361/707; 361/715; 361/719; 361/818; 174/16.1; 174/16.3; 174/17 CT (58) Field of Classification Search ............... None
See application file for complete search history.

(56) References Cited

U.S. PATENT DOCUMENTS

| | | | | |
|---|---|---|---|---|
| 5,610,799 | A * | 3/1997 | Kato | ............... 361/752 |
| 6,140,577 | A * | 10/2000 | Rapaich et al. | ............ 174/365 |
| 6,188,014 | B1 * | 2/2001 | Richard et al. | ............ 174/350 |
| 6,267,386 | B1 | 7/2001 | Loll et al. | |
| 6,374,912 | B1 * | 4/2002 | LaGrotta et al. | ............ 165/185 |
| 6,385,045 | B1 * | 5/2002 | Tissington | ............... 361/704 |
| 6,455,768 | B2 * | 9/2002 | Negishi | ............... 174/17 CT |
| 6,522,538 | B1 * | 2/2003 | Hviid | ............... 361/690 |
| 6,573,448 | B2 * | 6/2003 | Mayer et al. | ............ 174/481 |
| 6,600,653 | B2 * | 7/2003 | Koike et al. | ............... 361/704 |
| 6,871,138 | B1 * | 3/2005 | Minelli | ............... 701/200 |
| 7,095,613 | B2 * | 8/2006 | Tsuchiya et al. | ............ 361/699 |
| 7,099,155 | B2 * | 8/2006 | Kobayashi et al. | ......... 361/719 |

FOREIGN PATENT DOCUMENTS

| | | |
|---|---|---|
| JP | 2003-69270 A | 3/2003 |
| JP | 2003-133756 A | 5/2003 |

* cited by examiner

*Primary Examiner*—Boris Chérvinsky
(74) *Attorney, Agent, or Firm*—Foley & Lardner LLP (57) ABSTRACT

An elastic seal member is formed at the surface of a metal plate included in a gasket, which faces toward a lid, and another elastic seal member is formed at the surface of the metal plate facing toward a side wall. At the metal plate, the seal member is disposed further inward relative to the other seal member fitted in a seal groove. As bolts are tightened, the seal members become compressed and deformed, causing the seal member to press the metal plate against an exposed portion of an inner wall portion and the other seal member to press the metal plate against the lid.

8 Claims, 10 Drawing Sheets

ELECTRONIC UNIT CASING

BACKGROUND OF THE INVENTION

1. Field of the Invention

The present invention relates to an electronic unit casing in which an electronic unit such as a power conversion device is housed.

2. Related Art

An electronic unit such as a power conversion device, which includes a power module with a high heat output value, is often housed in a casing cooled with a cooling device so as to improve the heat radiating effect. Japanese Laid-Open Patent Publication No. 2003-69270 discloses a cooling casing that adopts an electromagnetic wave shielding structure in order to reduce the leakage of electromagnetic waves generated in the power conversion device and the entry of external electromagnetic waves.

In the casing in the related art described above the electronic unit is disposed on a base member cooled with a cooling device, with a metal lid secured with bolts atop a side wall disposed so as to surround the electronic unit. A seal member such as an O-ring seal is disposed over tightening surfaces of the lid and the side wall at which they are fastened to each other, and thus, the casing is waterproofed. The side wall is formed by using a member having a double-layer structure constituted with a resin and a metal plate in order to minimize the weight of the casing and reduce the extent of heat entering from the external environment where the temperature may be very high.

The metal plate constituting the side wall, which is included in order to assure satisfactory levels of cooling performance and electromagnetic wave shielding performance, is partially exposed at the tightening surface of the side wall, and the exposed metal plate is placed in contact with the metal lid. As a result, the electromagnetic wave shielding performance in the casing is assured and, at the same time, the electronic unit housed inside the casing is expected to be cooled with better efficiency.

However, since the O-ring seal is disposed between the exposed portion of the metal plate and the bolt tightening portions, the lid may be allowed to tilt at the O-ring seal forming a fulcrum when the bolts are being tightened to lead to incomplete contact between the lid and the exposed metal plate portion or even to a complete failure to achieve contact due to a gap formed between them. In such an event, the electromagnetic wave shielding performance and the cooling performance would become poor.

SUMMARY OF THE INVENTION

An electronic unit casing according to a first aspect of the present invention comprises a base portion on which an electronic unit is disposed, that cools the electronic unit; a side wall that is erected on the base portion so as to surround the electronic unit and adopts a plural-layer structure comprising a metal inner wall and a heat insulating outer wall; a lid that is fixed to an upper end of the side wall with a tightening jig and includes an electromagnetic wave shielding material at least partially exposed at a surface facing opposite the side wall; and a gasket held between the lid and the upper end of the side wall. The metal inner wall comprises an exposed portion exposed at the upper end of the side wall; and the gasket comprises a metal plate in a ring shape, a first elastic seal unit that presses one surface of the metal plate against the exposed portion and seals a gap formed between the lid and the metal plate when the tightening jig is tightened, and a second elastic seal unit that presses another surface of the metal plate toward the electromagnetic wave shield material exposed at the lid and seals a gap formed between the metal plate and the upper end of the side wall when the tightening jig is tightened.

An electronic unit casing according to a second aspect of the present invention comprises a base portion on which an electronic unit is disposed, that cools the electronic unit; a side wall that is erected on the base portion so as to surround the electronic unit and adopts a plural-layer structure comprising a metal inner wall and a heat insulating outer wall; a lid that is fixed to an upper end of the side wall with a tightening jig and includes an electromagnetic wave shielding material at least partially exposed at a surface facing opposite the side wall; and a gasket held between the lid and the upper end of the side wall. The metal inner wall comprises an exposed portion exposed at the upper end of the side wall; and the gasket comprises a metal plate in a ring shape, a first elastic seal means for pressing one surface of the metal plate against the exposed portion and sealing a gap formed between the lid and the metal plate when the tightening jig is tightened, and a second elastic seal means for pressing another surface of the metal plate toward the electromagnetic wave shield material exposed at the lid and sealing a gap formed between the metal plate and the upper end of the side wall when the tightening jig is tightened.

DETAILED DESCRIPTION OF THE PREFERRED EMBODIMENTS

Figure 1:
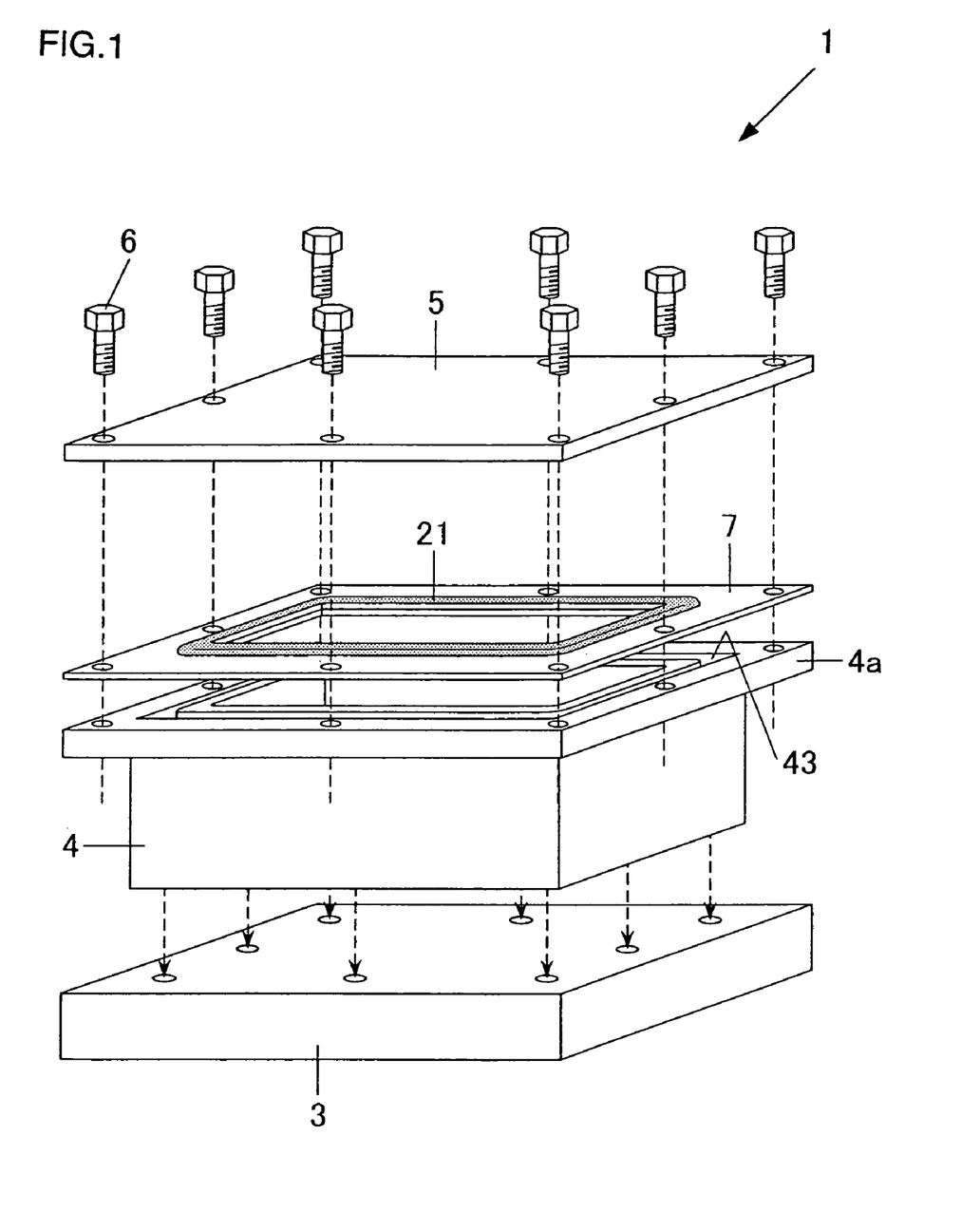
FIG. 1 is an exploded perspective of an electronic unit casing achieved in an embodiment of the present invention.

The following is an explanation of the preferred embodiments of the present invention, given in reference to the drawings. FIG. 1 is an exploded perspective of an electronic unit casing 1 achieved in an embodiment of the present invention. In a sectional view of the electronic unit casing 1 taken from the front, which is presented in FIG. 2, an electronic unit 2 is housed inside the electronic unit casing 1. As shown in FIG. 1, the electronic unit casing 1 comprises a base 3, a side wall 4 and a lid 5.

Figure 2:
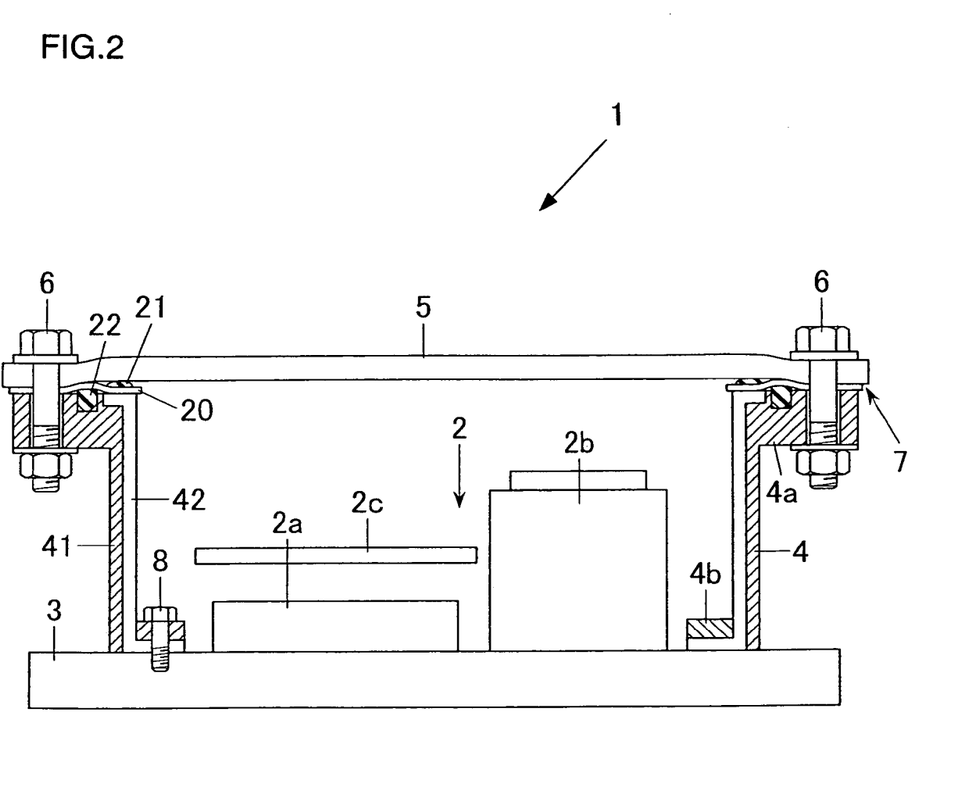
FIG. 2 shows a section of the electronic unit casing viewed from the front.

As shown in FIG. 2, flanges 4a and 4b are formed at the two ends, i.e., the upper and lower ends, of the side wall 4, with a seal groove 43 (see FIG. 1), in which a seal member 22 to be detailed later is fitted, formed at the upper surface of the flange 4a. When attaching the side wall 4 to the base 3, the flange 4b is fixed onto the base 3 with bolts 8. In addition, the lid 5 is fixed to the flange 4a at the side wall 4 with bolts 6. It is to be noted that a gasket 7 is clamped between the flange 4a and the lid 5. Although not shown, a seal member is also disposed between the flange 4b and the base 3 for water proofing.

The electronic unit 2 is mounted on the base 3. The electronic unit 2, which may be a power module used in an electric car, includes components such as a power module 2a, a capacitor 2b and a circuit board 2c. The circuit board 2c is supported at a column (not shown) extending upright on the base 3. The power module having installed therein a power conversion semiconductor element such as an IGBT or a MOSFET has a high heat output value.

In addition, the electronic unit casing 1 is often installed in a high temperature environment such as an engine compartment. For this reason, the base 3 is cooled with a cooling device and is formed by using a material such as a metal with good thermal conductivity and good electrical conductivity. For instance, a flow passage may be formed inside the metal base 3 so as to cool the base 3 by supplying a cooling liquid into the flow passage. The cooling liquid may be water or an ethylene glycol aqueous solution. The following explanation is given by assuming that the base 3 and the lid 5 are constituted with metal.

The side wall 4 has a double-layer structure constituted with an outer wall portion 41 and an inner wall portion 42. The outer wall portion 41 is constituted of a material such as resin with a low level of thermal conductivity, whereas the inner wall portion 42 is formed by using a material such as metal with high thermal conductivity and high electrical conductivity. The side wall 4 in this example is formed as an integrated unit by molding the metal inner wall portion 42 with the resin outer wall portion 41. It is desirable to use a resin that withstands high temperatures to constitute the outer wall portion 41, and examples of such a resin include PBT (polybutylene terephthalate), PA (polyamide) and PPS (polyphenylene sulfide).

The inner wall portion 42 may be constituted of aluminum, copper, brass or steel and since the material constituting the inner wall portion 42 should be as thin and light as possible and assure good machinability, it is desirable to use aluminum. In addition, copper with its good heat radiating performance and electromagnetic wave shielding performance is a viable option as well. The lower end of the inner wall portion 42 is bent in an L-shape and is exposed at or opposed to the lower end surface of the flange 4b, achieving contact with the metal base 3. Likewise, the upper end of the inner wall portion 42 is also bent in an L shape and is exposed at the upper surface of the flange 4a, thereby placing the inner wall portion 42 in contact with the lid 5 via the metal gasket 7.

As a result, with the cooling means such as cooling water cooling the inner surface of the electronic unit casing 1, heat radiation is achieved with a high degree of efficiency at the electronic unit 2 to inhibit an increase in temperature. In addition, the electronic unit casing 1 has an electromagnetic wave shielding function with which leakage of electromagnetic waves originating from the electronic unit 2 to the outside of the casing and entry of external electromagnetic waves into the casing are prevented. The metal lid 5 includes an electromagnetic shielding material and works as an electromagnetic wave shield member as a whole.

Figure 3A:
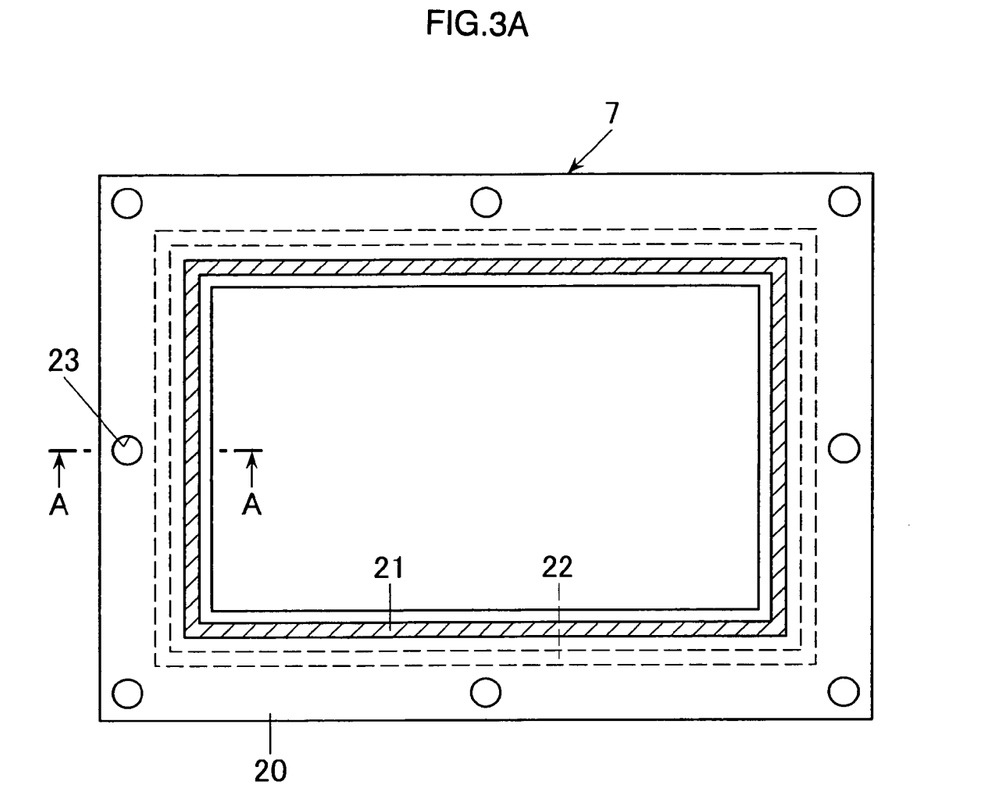
FIG. 3A is a plan view of a gasket.
Figure 3B:
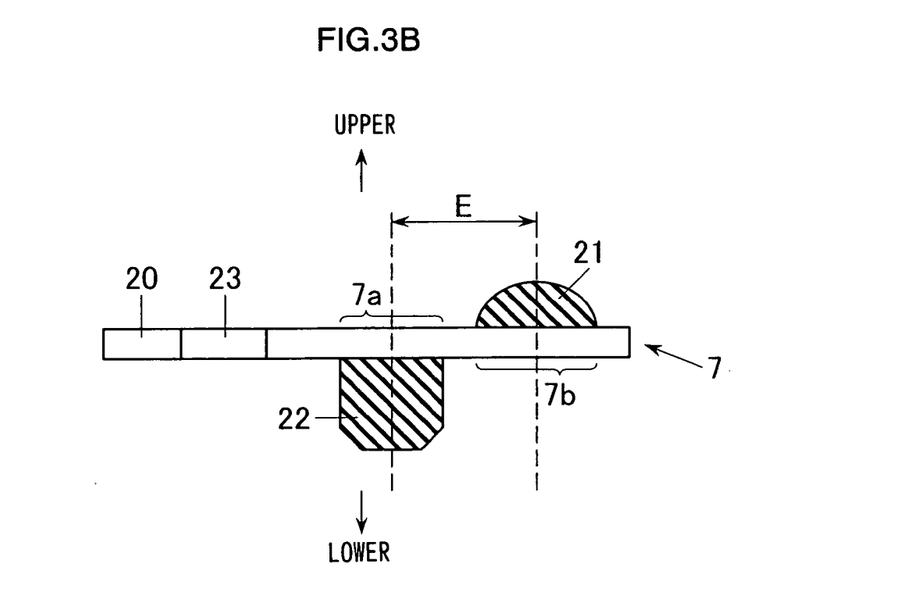
FIG. 3B is a sectional view of the gasket taken along A-A in FIG. 3A.

Next, the gasket 7 is explained. FIG. 3A is a plan view of the gasket 7 and FIG. 3B is a sectional view taken along A-A. The gasket 7 is constituted with a metal-plate 20 assuming a rectangular-ring shape, a seal member 21 disposed at the upper surface of the metal plate 20 and a seal member 22 disposed at the lower surface of the metal plate 20. The gap E between the seal member 21 and the seal member 22 is set substantially equal to the distance between the seal groove 43 at the side wall 4 and an exposed portion 42a (see FIGS. 4A and 4B) of the inner wall portion 42. A plurality of bolt holes 23 at which the bolts 6 in FIG. 1 are inserted are formed at the metal plate 20 over the area further outside the range over which the seal member 21 is disposed.

The metal plate 20 at the gasket 7 is sheet metal constituted of iron, aluminum, copper or the like, and the seal members 21 and 22 constituted of an elastic material such as acrylonitrile butadiene rubber (NBR) are bonded onto the upper surface and the lower surface of the metal plate 20. It is to be noted that while the seal member 21 is formed so as to have a semicircular section and the seal member 22 is formed so as to have a substantially rectangular section, their shapes are not limited to these examples.

Figure 4A:
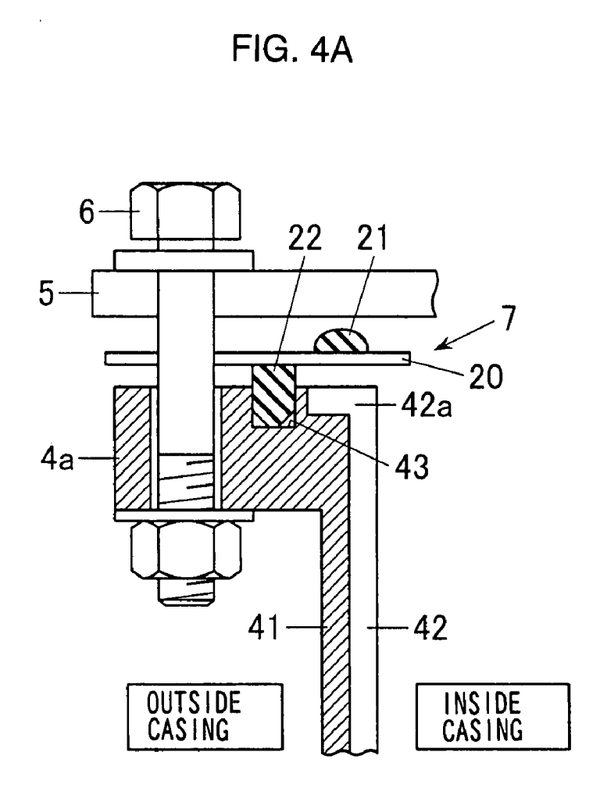
FIGS. 4A and 4B illustrate how the gasket becomes deformed as a lid is attached to a side wall with bolts, with FIG. 4A showing the gasket before the tightening torque is applied via the bolts and FIG. 4B showing the gasket with the tightening torque applied.
Figure 4B:
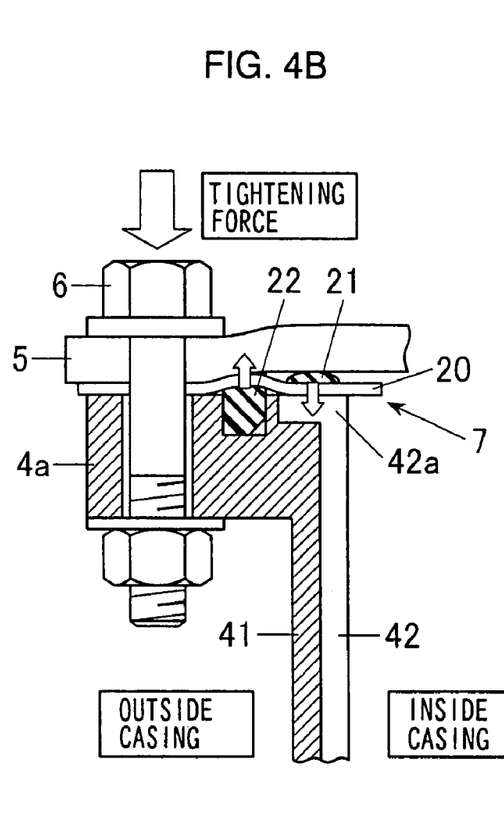

FIGS. 4A and 4B show how the gasket 7 becomes deformed as the lid 5 is attached to the side wall 4 with the bolts 6, with FIG. 4A showing the gasket 7 before the tightening torque is applied via the bolts 6 and FIG. 4B showing the gasket 7 after the tightening torque is applied. As shown in FIG. 4A, the gasket 7 is placed on the flange 4a so as to place the seal member 22 at the lower surface of the metal plate 20 into the seal groove 43.

Before the bolts 6 are tightened, the seal members 21 and 22 undergo hardly any deformation and gaps are formed between the metal plate 20 and the flange 4a and between the metal plate 20 and the lid 5. It is to be noted that the seal member 21 at the metal plate 20 is formed so that when the gasket 7 is set on the flange 4a, the position of the seal member 21 is substantially aligned to the position of the exposed portion 42a of the inner wall portion 42 bent in the L shape.

As the bolts 6 in the state shown in FIG. 4A are rotated and tightened, the lid 5 becomes pushed down and the distance between the lid 5 and the flange 4a becomes smaller. At this time, a downward force is applied to the metal plate 20 from the seal member 21, as indicated by the an arrow shown in FIG. 4B and also, an upward force is applied to the metal plate 20 from the seal member 22. As a result, the metal plate 20 clamped between the seal member 21 and the seal member 22 is caused to become deformed by the forces applied along opposite directions. Consequently, the lower surface of the metal plate 20 further inward relative to the position of the seal member 21 is pressed against the exposed portion 42a of the inner wall portion 42, whereas the upper surface of the metal plate 20 further outward relative to the position of the seal member 22 is pressed against the lower surface of the lid 5.

In the state shown in FIG. 4B, the seal members 21 and 22 are elastically deformed by the tightened bolts 6. Thus, a rectangular-ring shaped area of the metal plate 20 over which the seal member 21 is disposed is caused to become uniformly deformed over the entire area by the elastic force imparted from the seal member 21 and this entire area achieves substantially uniform metal-to-metal contact with the exposed portion 42a of the inner wall portion 42. Likewise, a rectangular-ring shaped area of the metal plate 20 over which the seal member 22 is disposed is caused to become uniformly deformed over the entire area by the elastic force imparted from the seal member 22 and this entire area achieves substantially uniform metal-to-metal contact with the lower surface of the lid 5. In addition, the elastic forces from the seal members 21 and 22 increase the contact pressures at the areas where the metal-to-metal contact is achieved.

As a result, sufficient levels of metal-to-metal contact are assured between the metal plate 20 and the lid 5 and between the metal plate 20 and the inner wall portion 42, thereby improving the electromagnetic wave shielding performance of the electronic unit casing 1. In addition, since sufficient levels of metal-to-metal contact are assured, the lid 5 is cooled with a high degree of efficiency so as to improve the level of heat radiation at the electronic module 2. Furthermore, since the gap between the metal plate 20 and the lid 5 is sealed with the seal member 21 and the gap between the metal plate 20 and the upper end of the side wall 4 is sealed with the seal member 22, a tight seal is assured.

Figure 5A:
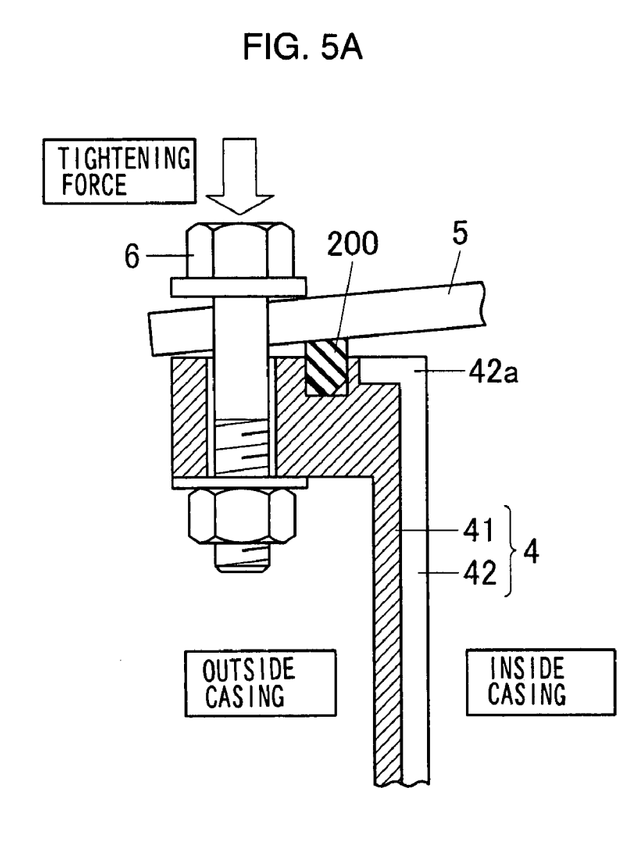
FIG. 5A shows a first comparison example and FIG. 5B shows a second comparison example.
Figure 5B:
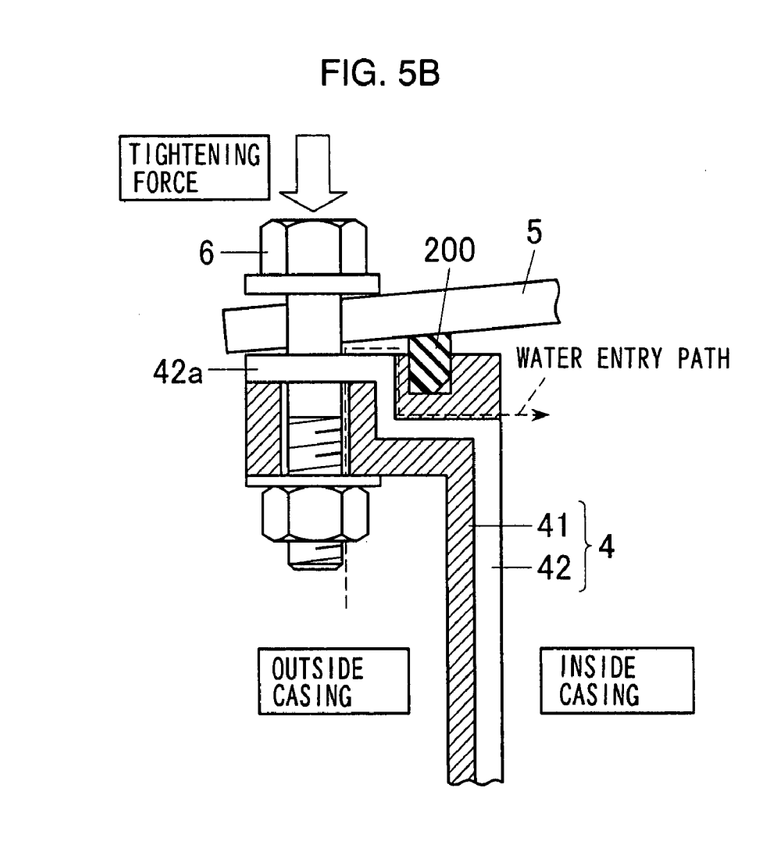

FIGS. 5A and 5B show the relationship between the lid 5 and the side wall 4 in casings formed by using a standard seal member 200 in comparison examples, with FIG. 5A presenting a first comparison example and FIG. 5B presenting a second comparison example. In the first comparison example presented in FIG. 5A, the lid 5, which becomes tilted at the seal member 200 forming a fulcrum as the bolts 6 are tightened, becomes fixed in a tilted state. In this situation, a gap is formed between the lid 5 and the exposed portion 42a of the inner wall portion 42 and, as a result, the lid 5 cannot be cooled thoroughly to result in reduced heat radiation at the electronic unit 2. In addition, with electromagnetic waves allowed to enter or exit through this gap, the electromagnetic shielding performance, too, becomes poorer.

In the second comparison example presented in FIG. 5B, the exposed portion 42a of the inner wall portion 42 is disposed further outward relative to the seal member 200 so as to assure better contact between the exposed portion 42a and the lid 5. While the lid 5 and the exposed portion 42a come into contact, the structure may allow water to enter the casing via the interface layer between the resin material constituting the outer wall portion 41 and the metal plate constituting the inner wall portion 42 to compromise the waterproofing performance.

In contrast, the structure achieved in the embodiment, in which the metal plate 20 is caused to become deformed by the elastic forces imparted from the seal members 21 and 22 to be pressed against the lid 5 and the exposed portion 42a, ensures that the metal plate 20 is deformed so as to conform to the contour of the lid 5 even when the lid 5 is slightly tilted, as shown in FIG. 5A or 5B and thus, the state of full contact is sustained.

While the lid 5 and the metal plate 20 may be constituted of iron, aluminum, copper or the like, the thickness of the metal plate 20 is set to a value that allows it to become uniformly deformed when the bolts 6 are tightened. For instance, the thickness of the lid 5 may be set to 1.0 mm and the thickness of the metal plate 20 may be set to 0.2 mm. In this case, the rigidity of the metal plate 20 is lower than the rigidity of the lid 5 so that a deformation such as that shown in FIG. 4B is achieved with the elastic forces imparted from the seal members 21 and 22.

(First Variation)

Figure 6:
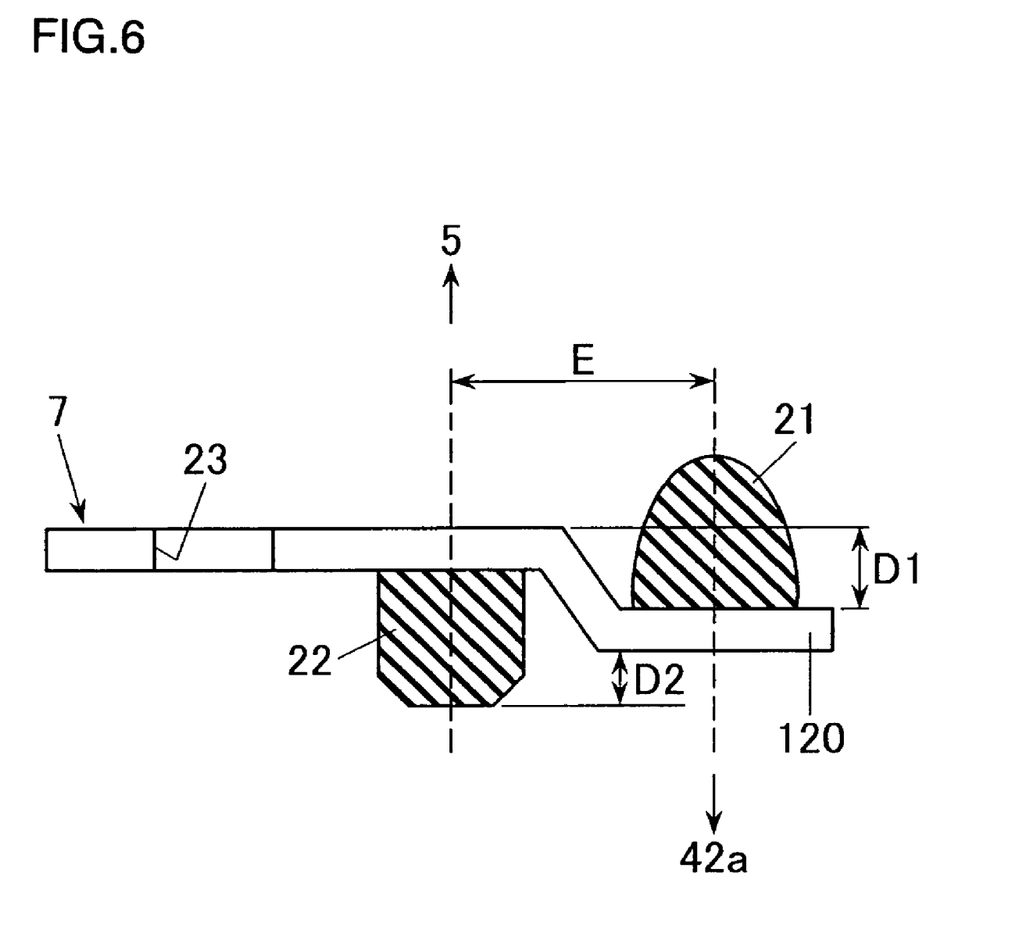
FIG. 6 is a sectional view of a first variation of the gasket.

While the embodiment described above adopts the structure in which the tightening force from the bolts 6 causes deformation of the flat metal plate 20 between the seal member 21 and the seal member 22, a metal plate 120 may be formed to have a stage between the seal member 21 and the seal member 22 as in the gasket 7 shown in FIG. 6. The distance E between the seal member 21 and the seal member 22 is set substantially equal to the distance between the seal groove 43 at the side wall 4 and the exposed portion 42a of the inner wall portion 42, as in FIG. 3B.

Figure 7A:
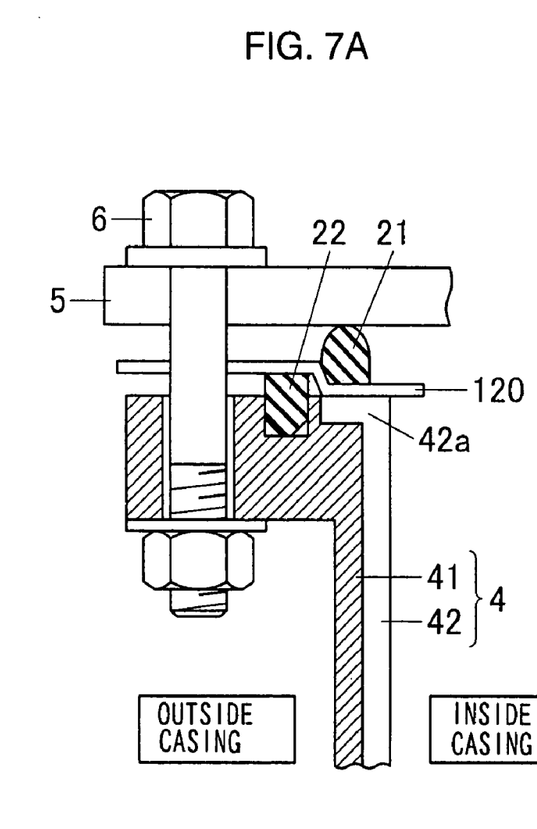
FIGS. 7A and 7B show the gasket achieved in the first variation in a mounted state, with FIG. 7A showing the shape of a section of the gasket before the bolts are tightened and FIG. 7B showing the shape of a section of the gasket with the bolts tightened.
Figure 7B:
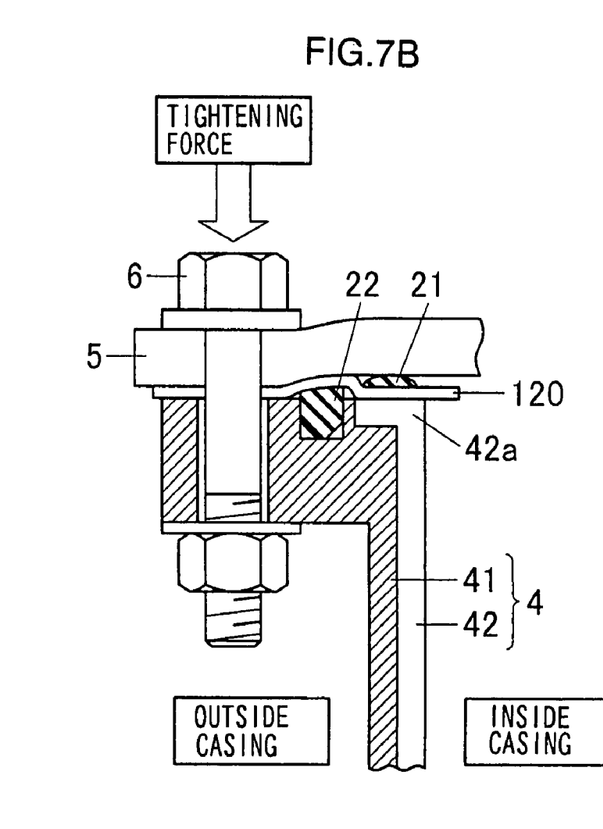

The dimension D1 of such a stage should be set to a value that allows the seal member 21 to become compressed as the bolts 6 are tightened so as to place the lid 5 and the portion of the metal plate 120 over which the seal member 22 is disposed in contact with each other, to cause the metal plate 120 to become deformed to further reduce the height of the stage, and to ultimately compress the seal member 22 as shown in FIG. 7B. For this reason, it is desirable to set a bonding surface of the seal member 21 to the metal plate 120 lower than a bonding surface of the seal member 22 to the metal plate 120, as shown in FIG. 6. Furthermore, a sufficiently tight seal can be assured by setting the dimension D2 with regard to the seal member 22 greater than the depth of the seal groove 43.

FIGS. 7A and 7B show the state of the gasket 7 before and after the bolts are tightened, with FIG. 7A showing the shape of a section of the gasket 7 before the bolts are tightened and FIG. 7B showing the shape of a section of the gasket 7 after the bolts are tightened. As shown in FIG. 7B, the seal member 21 is compressed as the bolts 6 are tightened, and the elastic force imparted from the seal member 21 at this time presses the portion of the metal plate 120 over which the seal member 21 is disposed against the exposed portion 42a of the inner wall portion 42.

As the force with which the bolts 6 are tightened is further increased, the metal plate 120 becomes deformed over the staged area, thereby compressing and deforming the seal member 22. As a result, the portion of the metal plate 120 over which the seal member 22 is disposed is pressed against the lid 5, thereby assuring full metal-to-metal contact between the metal plate 120 and the inner wall portion 42 and between the metal plate 120 and the lid 5. By achieving specific dimensions for the stage at the metal plate 120 through molding, larger metal-to-metal contact areas can be formed more easily compared to the structure described earlier, in which the metal plate 20 is deformed by the tightening forces.

(Second Variation)

Figure 8A:
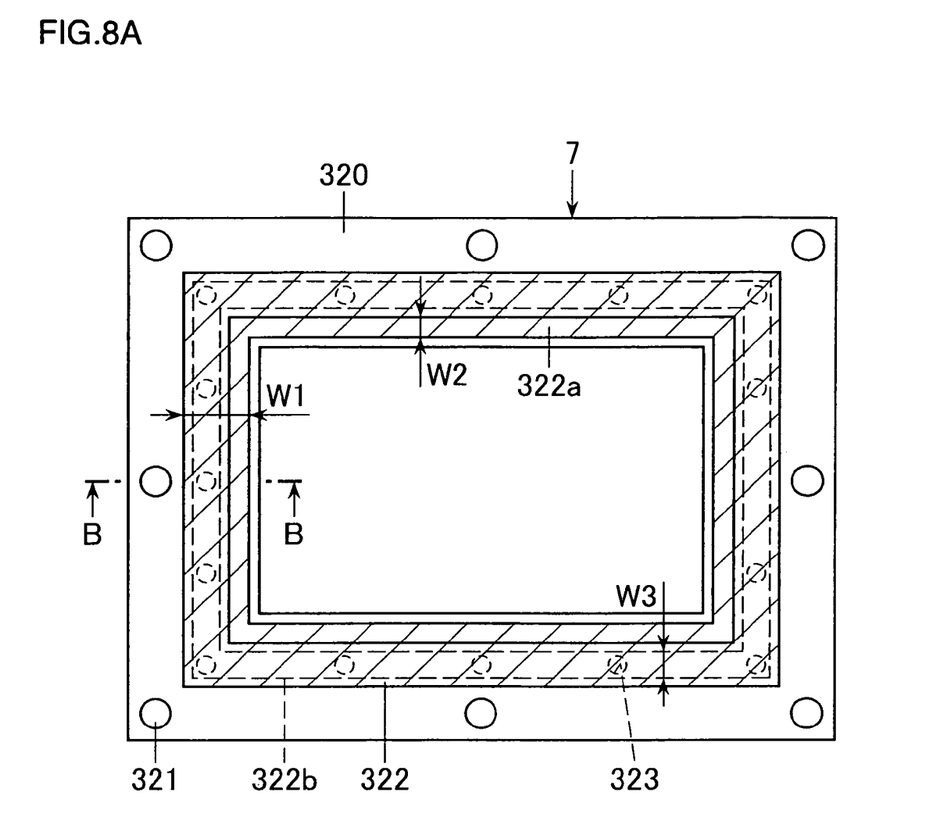
FIG. 8A is a plan view of a second variation of the gasket and FIG. 8B is a sectional view taken along B-B in FIG. 8A.
Figure 8B:
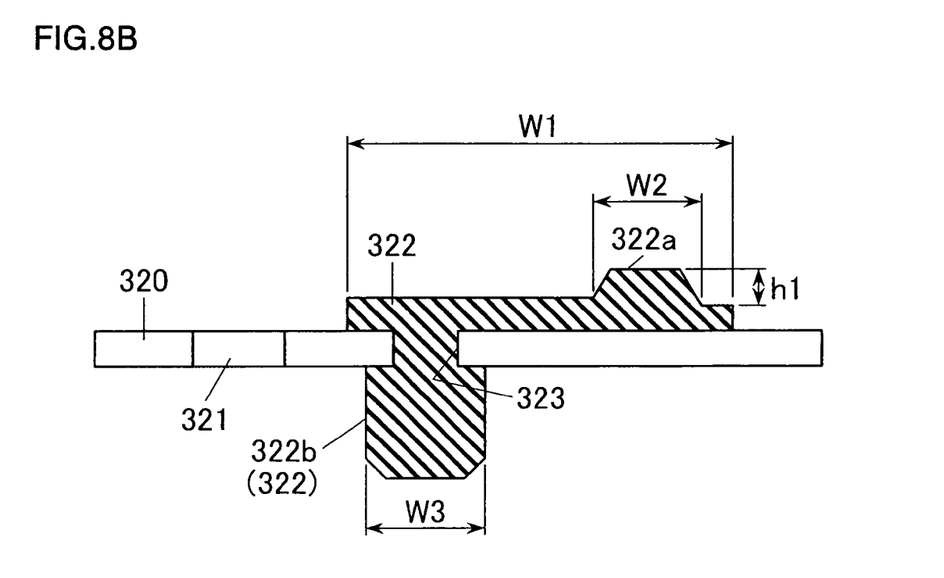

FIG. 8A is a plan view of the second variation of the gasket 7 and FIG. 8B is a sectional view taken along B-B in FIG. 8A. In addition to bolt holes 321, a plurality of holes 323 through which seal members 322 are inserted are formed at a metal plate 320 of the gasket 7. The metal plate 320 and the seal members 322 are respectively constituted with materials similar to those constituting the metal plate 20 and the seal members 21 and 22.

The seal members 322 are formed in the shape of a rectangular ring and are disposed at the two surfaces, i.e., the front and rear surfaces of the metal plate 320. The seal members 322 disposed at the front and rear surfaces of the metal plate 320 connect with each other via the holes 323 formed in the metal plate 320. The seal member 322 disposed on the upper side surface of the metal plate 320 assumes the shape of a rectangular-ring with a width W1, with a projected seal portion 322a assuming the shape of a rectangular-ring with a width W2 and a height h2 formed on the seal member 322 with the width W1. The seal member 322 on the lower side, which connects with the seal member 322 on the upper side via the holes 323, constitutes a seal portion 322b with a width W3. These seal portions 322a and 322b respectively correspond to the seal member 21 and the seal member 22 in FIG. 3.

Figure 9A:
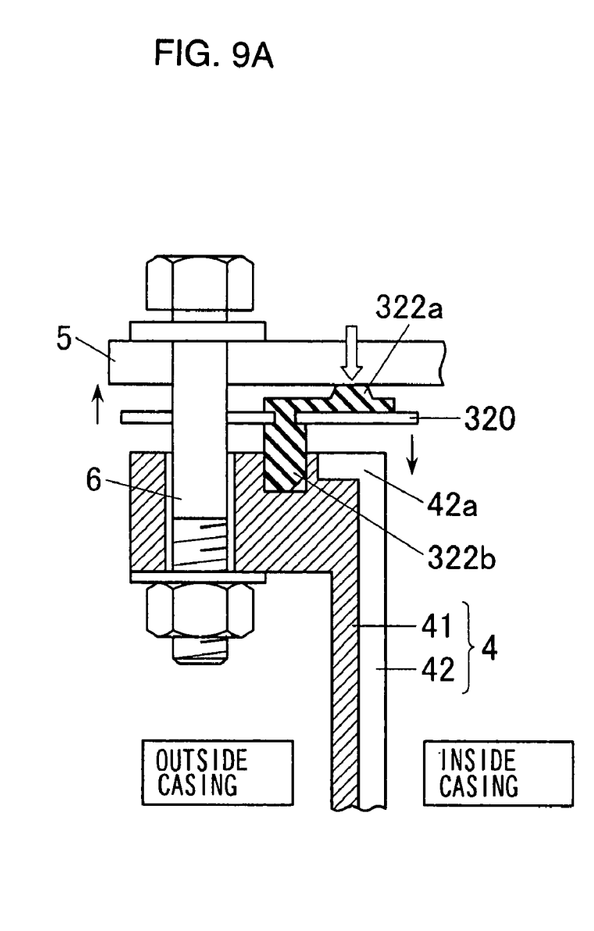
FIGS. 9A and 9B show the gasket achieved in the second variation in a mounted state, with FIG. 9A showing the shape of a section of the gasket before the bolts are tightened and FIG. 9B showing the shape of a section of the gasket with the bolts tightened.
Figure 9B:
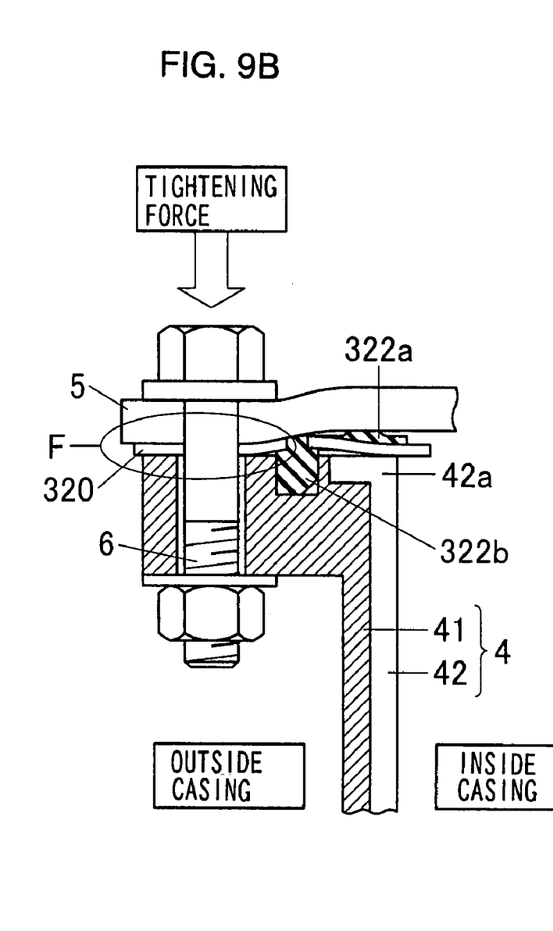

FIGS. 9A and 9B show the state of the gasket 7 in the second variation before and after the bolts are tightened, with FIG. 9A showing the shape of a section of the gasket 7 before the bolts 6 are tightened and FIG. 9B showing the shape of a section of the gasket 7 after the bolts 6 are tightened. As the bolts 6 in the state shown in FIG. 9A are tightened, the lid 5 pushes the seal portion 322a downward in the figure, causing deformation of the metal plate 320 by displacing the inner side (the right side in the figure) along the downward direction. With the inner side of the metal plate 320 displaced downward around the seal portion 322b forming a fulcrum, a force is applied to the outer side of the metal plate 320 toward the lid 5.

When the bolts 6 are completely tightened as shown in FIG. 9B, the portion of the metal plate 320 over which the seal portion 322a is disposed is placed in contact with the exposed portion 42a of the inner wall portion 42 and it is pressed against the exposed portion 42a with the elastic force of the seal portion 322a. The outer portion of the metal plate 322 indicated by the letter F, on the other hand, is pressed against the lid 5 with the elastic force on the metal plate 320 and the elastic force of the seal portion 322a. Since the seal members 322 can be formed together when the metal plate 320 is formed, the gasket 7 in the second variation can be manufactured through a smaller number of forming steps to achieve a reduction in the production costs.

While the seal groove 43 is formed at the side wall 4 in the embodiments explained above, the side wall 4 may instead have a flat seal surface with no groove. In addition, by forming the metal plate 20, 120 or 320 at the gasket 7, the lid 5 and the inner wall portion 42 with a single metal material such as aluminum, corrosion and stray current corrosion that occur when different types of metal come into contact with each other can be prevented. It is to be noted that in the above described embodiments the seal members 21, 22, 322 work as elastic seal units or elastic seal means for sealing a gap between the lid 5 and the metal plate 20, 120, 320 and a gap between the metal plate 20, 120, 320 and the side wall 4.

Figure 10:
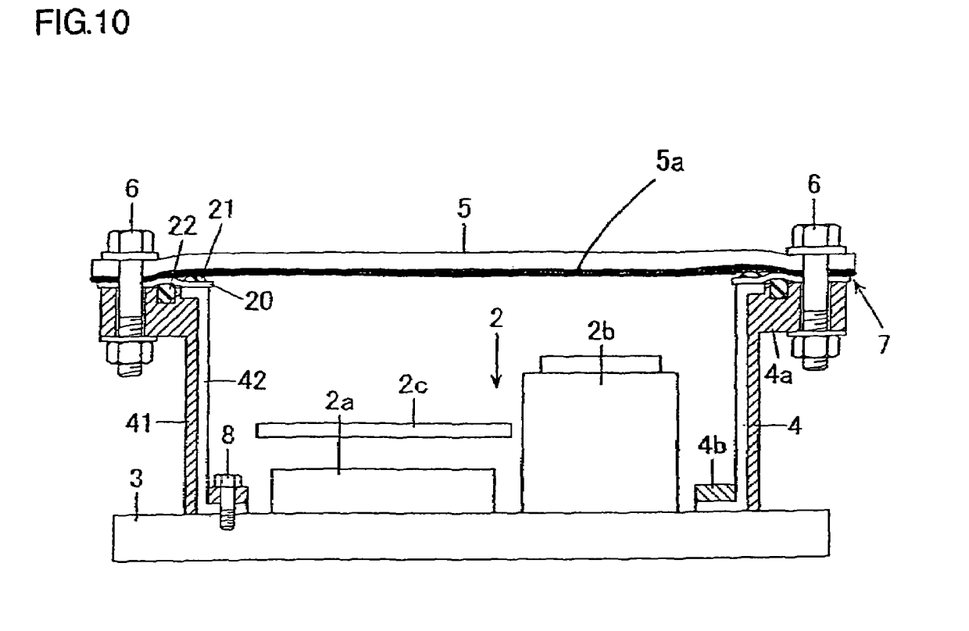
FIG. 10 shows a section of the electronic unit casing with an electromagnetic shield material molded in a resin at the lid.

It is to be noted that while the heat radiating performance would be somewhat compromised, the lid 5 may be formed by using an electromagnetic wave shielding material 5a such as metal mesh molded in a resin. In such a structure, the electromagnetic wave shielding material 5a should be exposed at the surface facing opposite the gasket 7 to achieve metal-to-metal contact with the metal plate 20, 120 or 320. The electromagnetic wave shielding material 5a may be exposed at least at a portion corresponding to the flange 4a of the side wall 4.

Figure 11:
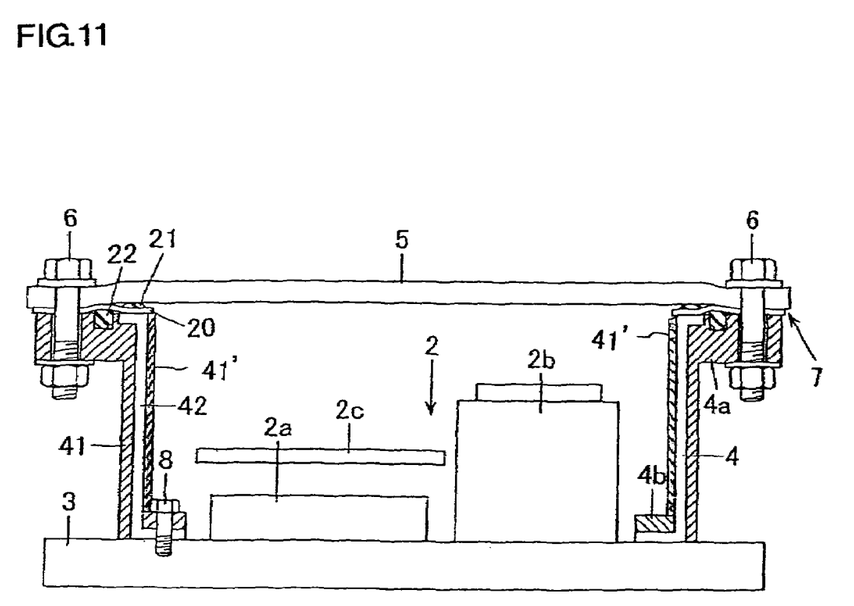
FIG. 11 shows a section of the electronic unit casing with the side wall having a triple-layer structure.

It is also possible that the side wall 4 has a triple-layer structure constituted with the outer wall portion 41, the inner wall portion 42 and an inner most wall portion 41'. The innermost wall portion 41' is disposed inside the inner wall portion 42 and is constituted of a material such as a resin with a low level of thermal conductivity as that of the outer wall portion 41. In other words, the side wall 4 can be formed as a plural-layer structure with at least two layers.

According to the embodiments explained above, full contact is achieved between the lid 5 and the metal plate 20, 120, 320 and between the metal plate 20, 120, 320 and the inner wall portion 42, and the lid 5 and the inner wall portion 42 are cooled by the base 3. As a result, more effective heat radiation is achieved for the electronic unit 2 and an improvement in the electromagnetic wave shielding performance is realized.

The present invention is not limited to the examples presented in the embodiments as long as the features characterizing the present invention are retained.

INCORPORATION BY REFERENCE

The disclosure of the following priority application is herein incorporated by reference: Japanese Patent Application No. 2004-045746 filed Feb. 23, 2004

What is claimed is:

1. An electronic unit casing, comprising:
a base portion on which an electronic unit is disposed, that cools the electronic unit;
a side wall that is erected on the base portion so as to surround the electronic unit and adopts a plural-layer structure comprising a metal inner wall and a heat insulating outer wall;
a lid that is fixed to an upper end of the side wall with a tightening jig and includes an electromagnetic wave shielding material at least partially exposed at a surface facing opposite the side wall; and
a gasket held between the lid and the upper end of the side wall, wherein:
the metal inner wall comprises an exposed portion exposed at the upper end of the side wall; and
the gasket comprises a metal plate in a ring shape, a first elastic seal unit that presses one surface of the metal plate against the exposed portion and seals a gap formed between the lid and the metal plate when the tightening jig is tightened, and a second elastic seal unit that presses another surface of the metal plate toward the electromagnetic wave shield material exposed at the lid and seals a gap formed between the metal plate and the upper end of the side wall when the tightening jig is tightened.

2. An electronic unit casing according to claim 1, wherein:
the first elastic seal unit and the second elastic seal unit are formed at the metal plate so as to dispose the second elastic seal unit between a tightening portion of the tightening jig and the first elastic seal unit.

3. An electronic unit casing according to claim 1, wherein:
the metal plate in the ring shape is bent to form a staged portion with an inner area of the ring shape projecting out toward the upper end of the side wall and an outer area of the ring shape projecting out toward the lid, the first elastic seal unit is formed at a surface of the metal plate facing toward the lid on the inner area, and the second elastic seal unit is formed at a surface of the metal plate facing toward the upper end of the side wall on the outer area.

4. An electronic unit casing according to claim 1, wherein:
a through hole passing from a front surface through a rear surface of the metal plate is formed in the metal plate; and
the first elastic seal means and the second seal means are formed in a ring shape at a front surface and a rear surface of the metal plate and connected with each other via the through hole.

5. An electronic unit casing according to claim 4, wherein:
the first elastic seal unit comprises a first projecting portion that presses the one surface of the metal plate toward the exposed portion and seals the gap between the lid and the metal plate when the tightening jig is tightened, and
the second elastic seal means comprises a second projecting portion that presses the other surface of the metal plate toward the electromagnetic wave shielding material exposed at the lid and seals the gap between the metal plate and the upper end of the side wall when the tightening jig is tightened.

6. An electronic unit casing according to claim 5, wherein:
the first projecting portion and the second projecting portion are formed at the first elastic seal unit and the second elastic seal unit respectively so that the second projecting portion is disposed between a tightening portion of the tightening jig and the first projecting portion.

7. An electronic unit casing according to claim 1, wherein:
the lid, the metal inner wall and the metal plate are formed by using a same metal material.

8. An electronic unit casing, comprising:
a base portion on which an electronic unit is disposed, that cools the electronic unit;
a side wall that is erected on the base portion so as to surround the electronic unit and adopts a plural-layer structure comprising a metal inner wall and a heat insulating outer wall;
a lid that is fixed to an upper end of the side wall with a tightening jig and includes an electromagnetic wave shielding material at least partially exposed at a surface facing opposite the side wall; and
a gasket held between the lid and the upper end of the side wall, wherein:
the metal inner wall comprises an exposed portion exposed at the upper end of the side wall; and
the gasket comprises a metal plate in a ring shape, a first elastic seal means for pressing one surface of the metal plate against the exposed portion and sealing a gap formed between the lid and the metal plate when the tightening jig is tightened, and a second elastic seal means for pressing another surface of the metal plate toward the electromagnetic wave shield material exposed at the lid and sealing a gap formed between the metal plate and the upper end of the side wall when the tightening jig is tightened.

* * * * *